United States Patent [19]

Manley

[11] Patent Number: 5,365,127
[45] Date of Patent: Nov. 15, 1994

[54] CIRCUIT FOR CONVERSION FROM CMOS VOLTAGE LEVELS TO SHIFTED ECL VOLTAGE LEVELS WITH PROCESS COMPENSATION

[75] Inventor: Robert B. Manley, Ft. Collins, Colo.

[73] Assignee: Hewlett-Packard Company, Palo Alto, Calif.

[21] Appl. No.: 139,247

[22] Filed: Oct. 18, 1993

[51] Int. Cl.[5] .................................. H03K 19/0175
[52] U.S. Cl. .................................. 326/73; 326/68
[58] Field of Search ............... 307/448, 451, 475, 443, 307/296.5

[56] References Cited

U.S. PATENT DOCUMENTS

| | | | |
|---|---|---|---|
| 4,791,322 | 12/1988 | Graham | 307/475 |
| 4,808,852 | 2/1989 | Kousaka | 307/475 |
| 4,998,028 | 3/1991 | Chappell | 307/451 |
| 5,043,605 | 8/1991 | Gabara | 307/451 |

*Primary Examiner*—Edward P. Westin
*Assistant Examiner*—Andrew Sanders

[57] ABSTRACT

A CMOS level conversion circuit for converting voltage levels between CMOS levels and shifted ECL levels, where the shifted ECL levels are referenced to the VDD supply voltage of the CMOS circuit. The circuit contains a pFET connected between the VDD supply voltage and the output terminal and an nFET connected between the output terminal and circuit ground. The input signal is connected to the gate input of the nFET. A second pFET is connected in parallel to the nFET between the output terminal and ground. A bias voltage is supplied to the gate inputs of both pFETs, to cause the output terminal to have a shifted ECL logic one voltage when the gate to the nFET is low. The pFETs are fabricated within the integrated circuit to be located very close to each other to compensate for variations in the CMOS integrated circuit manufacturing process.

7 Claims, 1 Drawing Sheet

CIRCUIT FOR CONVERSION FROM CMOS VOLTAGE LEVELS TO SHIFTED ECL VOLTAGE LEVELS WITH PROCESS COMPENSATION

FIELD OF THE INVENTION

This invention relates to electronic circuits and more particularly to electronic circuits within a Complementary Metal Oxide Semiconductor (CMOS) Integrated Circuit. Even more particularly, the invention relates to a circuit for converting between CMOS and shifted Emitter Coupled Logic circuit voltage levels that includes compensation for manufacturing process variations.

BACKGROUND OF THE INVENTION

CMOS integrated circuits are a logic family that is widely used in designing electronic circuits because it uses very little power. Emitter Coupled Logic (ECL) circuits use much more power, however, ECL is much faster than CMOS and is used when CMOS is not fast enough for the circuit. The reduced voltage swing of ECL causes less radiation of signals connected through a printed circuit board. Also, ECL is designed to drive transmission lines having low impedance, so it provides better signal characteristics between integrated circuits at high frequencies. For example, ECL is used when providing high frequency signals to generate video signals for very high resolution cathode ray tubes used in computer workstations.

CMOS integrated circuits typically use a 5 volt supply for operation, and the logic levels change over the entire range of this voltage, that is, 0 volts is output for a logic zero, and 5 volts is output for a logic one. ECL has traditionally used a $-5.2$ volt supply. The ECL circuits reference their logic levels from ground and output is over a much narrower range, having worst case values of $-1.1$ for a logic one, and $-1.5$ for a logic zero.

ECL circuits can be combined with CMOS circuits by also using the CMOS $+5$ volt supply voltage for the ECL, and having the ECL reference its signals to the $+5$ volt supply, rather than ground. When this is done, the ECL logic one will be 3.9 volts, and the ECL logic zero will be 3.5 volts. This method provides the speed benefits of ECL while allowing the circuits to be combined into a single integrated circuit. ECL used in this manner is sometimes called "pseudo" ECL, positive ECL or shifted ECL.

Because of the narrow range between worst case values for a logic one and a logic zero, variations in the CMOS fabrication process can seriously affect whether the ECL circuit will function correctly. If the process variation causes the CMOS transistors to be "fast" or "slow", although still within the CMOS fabrication process tolerance, the circuits that convert between CMOS levels and ECL levels may not provide sufficient margin to function properly.

There is a need in the art then for a conversion circuit that converts between CMOS and ECL voltage levels, fabricated within a CMOS integrated circuit, that provides adequate output margins over all ranges of fabrication process variations. The present invention meets this and other needs.

SUMMARY OF THE INVENTION

It is an aspect of the present invention to provide a level conversion circuit to convert CMOS logic voltage levels to shifted ECL logic voltage levels.

It is another aspect of the circuit to maintain ECL logic level margins over a range of CMOS fabrication process variations.

The above and other aspects of the invention are accomplished in a CMOS level conversion circuit for converting voltage levels between CMOS levels and shifted ECL levels. The shifted ECL levels are referenced to the VDD voltage of the CMOS circuit and can be connected to ECL circuits that are connected between the CMOS VDD voltage and ground.

The level conversion circuit contains a pFET connected between the VDD supply voltage and the output terminal and an nFET connected between the output terminal and circuit ground. The input signal is connected to the gate input of the nFET. A second pFET is connected in parallel to the nFET between the output terminal and ground. A voltage divider is connected between VDD and ground to supply a bias voltage to the gate inputs of both pFETs. The bias voltage causes the output terminal to have a shifted ECL logic one voltage when the gate to the nFET is low, which is CMOS logic level zero, and the circuit is driving the desired characteristic impedance. This bias voltage is typically created by connecting two diode-connected pFETs in series between VDD and ground, and connecting the center of this voltage divider to the gates of the pFETs.

The first and second pFETs are fabricated within the integrated circuit to be located very close to each other to compensate for variations in the CMOS integrated circuit manufacturing process. Since the pFETs are close to each other, a process variation that affects one will affect the other FET. Thus if the first pFET is "fast" within a given manufacturing batch, the second pFET will also be fast and will compensate. The same effect occurs if both transistors are slow.

BRIEF DESCRIPTION OF THE DRAWINGS

The above and other aspects, features, and advantages of the invention will be better understood by reading the following more particular description of the invention, presented in conjunction with the following drawings, wherein.

DESCRIPTION OF THE PREFERRED EMBODIMENT

Figure 1:
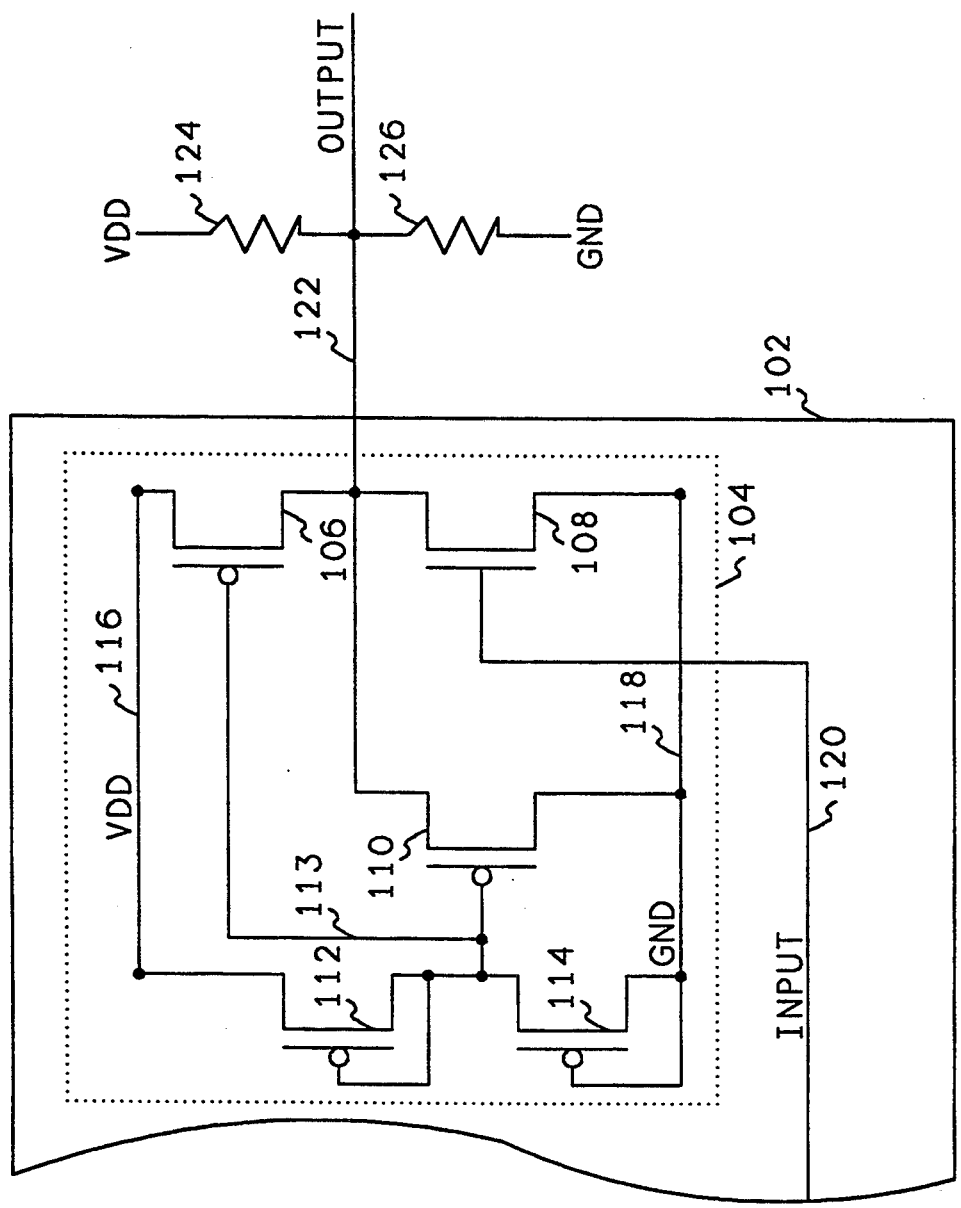
FIG. 1 shows a schematic diagram of the CMOS to ECL conversion circuit of the invention.

The following description is of the best presently contemplated mode of carrying out the present invention. This description is not to be taken in a limiting sense but is made merely for the purpose of describing the general principles of the invention. The scope of the invention should be determined by referencing the appended claims.

The present invention is a logic level converter circuit used to convert CMOS levels to shifted ECL logic levels. Shifted ECL logic is ECL logic connected between the CMOS VDD supply and ground. The shifted ECL logic one voltage is 3.9 to 4.2 volts, and the shifted ECL logic zero voltage is 3.0 to 3.5 volts.

FIG. 1 shows a schematic diagram of the invention. Referring now to FIG. 1, a CMOS integrated circuit 102 contains the circuit 104 of the present invention. Within the circuit 104, a pFET 106 is connected between VDD 116 and the output 122. An nFET 108 is connected between the output 122 and circuit ground 118. Input to the circuit is a CMOS level voltage connected to the gate of nFET 108.

A second pFET 110 is connected in parallel to the nFET 108 between the output 122 and circuit ground 118. A bias voltage for the two pFETs is created by a voltage divider comprising diode connected pFETs 112 and 114, connected in series between VDD 116 and circuit ground 118. The values for pFETs 112 and 114 are set to cause the output 122 to have a shifted ECL logic one voltage output when the gate 120 of nFET 108 is low, which is a CMOS level zero, and when the output 122 is driving the desired characteristic impedance. In the preferred embodiment, the bias voltage is set to approximately VDD/2.

For the present invention, the characteristic impedance is 75 ohms, set by two resistors 124 and 126, which are connected to the circuit output, external to the integrated circuit. This impedance is set by using a 100 ohm resistor for resistor 124, and by using a 300 ohm resistor for resistor 126. This causes the output voltage to nominally be 3.7 volts, half way between a shifted ECL logic one and a shifted ECL logic zero voltage.

When operating, current flows through pFET 106 to the output 122. If the input 120 is a low level, that is, CMOS logic level zero, nFET 108 is cut off and the current flows out the output 122 which raises the output voltage to a value greater than 3.9 volts, which is a logic one for shifted ECL. If the input 120 is a high level, nFET 108 is turned on, which draws current from the output 122, pulling the output voltage below 3.5 volts, which is a logic zero for shifted ECL.

Because of the bias voltage on PFET 110, some current will always pass through pFET 110. The amount of current that passes through pFET 110 is determined by the bias voltage, the size of pFET 110, and the temperature of the circuit. For a given size of pFET 106, pFET 110 can be adjusted in size to pass enough current to keep the output 122 voltage at the desired high and low level voltages for shifted ECL.

For a 75 ohm termination, set by resistors 124 and 126, the size ratio of pFET 106 to pFET 110 is 2 to 1. For a 50 ohm termination, the size ratio is 2.45 to 1.

Since the bias voltage is created by components on the IC 102, it may vary with temperature and other factors. However, because pFET 106 and pFET 110 are both connected to the same bias voltage, the current through both transistors will be affected in the same way as the bias voltage changes. That is, if the bias voltage changes to cause a current increase through pFET 106, current will also increase through FET 110. This will tend to keep the same voltage at the output 122 as the bias voltage changes. Temperature changes will have the same effect, thus maintaining the output voltage within tolerance limits.

Also, having the bias voltage be dependent upon VDD allows the output signals of the circuit to shift proportional to any shifts in VDD.

The placement of the two pFETs adjacent or very close to each other on the integrated circuit keeps the circuit from being effected by process variations. If the manufacturing process produces a batch having "fast" transistors, pFET 106 and pFET 110 will both be fast, and the output 122 voltage will remain stable. Similarly if the process produces a batch having "slow" transistors, pFET 106 and pFET 110 will both be slow, keeping the output stable. In a batch having "fast" transistors, more current will pass through pFET 110, causing the same amount of current to pass through resistor 126, in order to create the same output voltage level.

As an alternative embodiment, the bias voltage could be set for pFETs 106 and 110 by using two resistors connected in series, in place of the pFETs 112 and 114. These resistors would have equal values, such as 250 K ohms, to create the desired bias voltage.

Those skilled in the art will recognize that there are many other ways to create the bias voltage.

Having thus described a presently preferred embodiment of the present invention, it will now be appreciated that the aspects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

What is claimed is:

1. A level conversion circuit for converting an input CMOS voltage level signal to a shifted ECL voltage level output signal within a CMOS integrated circuit, wherein said shifted ECL voltage level output signal is referenced to a supply voltage of said CMOS integrated circuit, said level conversion circuit comprising:

a first pFET connected between a supply voltage and said output signal;

an nFET connected between said output signal and a circuit ground, said nFET having said input signal connected to a gate thereof;

a second pFET connected in parallel to said nFET; and a bias voltage connected to a gate of said first pFET and further connected to a gate of said second pFET wherein said bias voltage biases said output to maintain a shifted ECL logic one voltage level when said input is a CMOS logic zero voltage level.

2. The level conversion circuit of claim 1 wherein said first pFET and said second pFET are fabricated to have a predefined physical size ratio.

3. The level conversion circuit of claim 2 wherein said predefined physical size ratio is 2 to 1 and said circuit is connected to a 75 ohm termination impedance.

4. The level conversion circuit of claim 2 wherein said first and second pFETs are fabricated physically adjacent each other.

5. The level conversion circuit of claim 1 wherein said first and second pFETs are fabricated physically adjacent each other.

6. The level conversion circuit of claim 1 wherein said bias voltage is created using a circuit comprising two equal valued resistors connected in series between said supply voltage and said circuit ground, wherein said bias voltage is connected between said series connected resistors.

7. The level conversion circuit of claim 1 wherein said bias voltage is created using a circuit comprising two diode connected pFET transistors connected in series between said supply voltage and said circuit ground, wherein said bias voltage is connected between said series connected pFETS.

* * * * *